(12) United States Patent
Kikutani et al.

(10) Patent No.: US 8,088,689 B2
(45) Date of Patent: Jan. 3, 2012

(54) METHOD OF FABRICATING SEMICONDUCTOR DEVICE

(75) Inventors: Keisuke Kikutani, Kanagawa (JP);
Katsunori Yahashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 12/395,094

(22) Filed: Feb. 27, 2009

(65) Prior Publication Data
US 2009/0221147 A1    Sep. 3, 2009

(30) Foreign Application Priority Data

Feb. 29, 2008 (JP) ................................. 2008-051240

(51) Int. Cl.
*H01L 21/302* (2006.01)
(52) U.S. Cl. .................. 438/693; 438/947; 438/694
(58) Field of Classification Search ................. None
See application file for complete search history.

(56) References Cited

U.S. PATENT DOCUMENTS

| | | | |
|---|---|---|---|
| 4,838,991 A | * | 6/1989 | Cote et al. ...................... 216/46 |
| 5,328,810 A | * | 7/1994 | Lowrey et al. ................ 430/313 |
| 6,924,191 B2 | | 8/2005 | Liu et al. |
| 2006/0234165 A1 | | 10/2006 | Kamigaki et al. |
| 2007/0161251 A1 | | 7/2007 | Tran et al. |

FOREIGN PATENT DOCUMENTS

JP    2006-303022    11/2006

OTHER PUBLICATIONS

Omura et al.; "Semiconductor Device Manufacturing Method", U.S. Appl. No. 12/336,348, filed Dec. 16, 2008.

* cited by examiner

*Primary Examiner* — Binh X Tran
*Assistant Examiner* — David Cathey, Jr.
(74) *Attorney, Agent, or Firm* — Finnegan, Henderson, Farabow, Garrett & Dunner, L.L.P.

(57) ABSTRACT

A method of fabricating a semiconductor device according to an embodiment includes: forming a core material on a workpiece material; forming a cover film to cover the upper and side surfaces of the core material; after forming the cover film, removing the core material; after removing the core material, removing the cover film while leaving portions thereof located on the side surfaces of the core material, so as to form sidewall spacer masks; and etching the workpiece material by using the sidewall spacer masks as a mask.

19 Claims, 5 Drawing Sheets

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-051240, filed on Feb. 29, 2008, the entire contents of which are incorporated herein by reference.

BACKGROUND

Recently, in accordance with miniaturization of a semiconductor element, the following method is needed, the method being capable of forming a pattern having a dimension less than an exposure resolution limit in lithography method. As one example of the method, the following method is known, the method including steps of forming sidewall patterns on side surfaces of dummy patterns (core materials) and etching a workpiece film by using the sidewall patterns as a mask. This method is, for example, disclosed in JP-A-2006-303022.

According to conventional methods described in above literature and the like, the dummy patterns located between the sidewall patterns are removed by a wet etching treatment after forming the sidewall patterns, which results in that a microscopical mask composed of the sidewall patterns are formed. Nowadays, it is needed to moreover miniaturize the pattern dimension and improve the dimensional accuracy.

BRIEF SUMMARY

A method of fabricating a semiconductor device according to an embodiment includes: forming a core material on a workpiece material; forming a cover film to cover the upper and side surfaces of the core material; after forming the cover film, removing the core material; after removing the core material, removing the cover film while leaving portions thereof located on the side surfaces of the core material, so as to form sidewall spacer masks; and etching the workpiece material by using the sidewall spacer masks as a mask.

DETAILED DESCRIPTION

First Embodiment

FIGS. 1A to 1G are cross-sectional views showing a fabricating process of a semiconductor device according to the first embodiment.

Figure 1A:
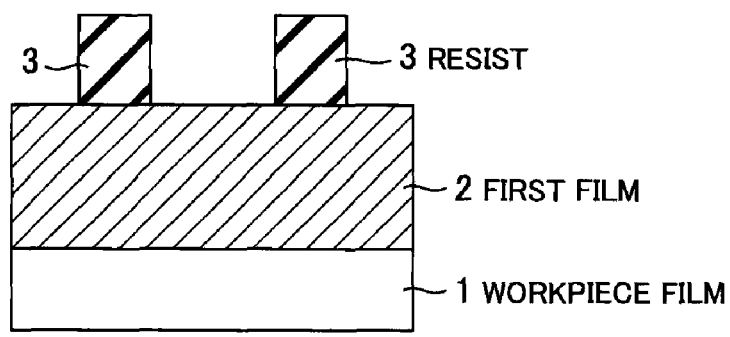
FIGS. 1A to 1G are cross-sectional views showing a fabricating process of a semiconductor device according to the first embodiment.

First, as shown in FIG. 1A, for example, a first film 2 is formed on a workpiece film 1 formed on a semiconductor substrate (not shown), and a resist 3 having a predetermined pattern is formed on the first film 2.

The workpiece film 1 is, for example, a gate material film of planar type transistor or a hard mask on a shaping object. Further, the workpiece film 1 can be a multilayer film including, for example, a control gate electrode film, an inter-electrode insulating film and a floating gate electrode film which constitute a stack gate structure of a flash memory. Further, the semiconductor substrate itself can be used as a shaping object (workpiece material).

Further, the first film 2 is made of C, $SiO_2$, SiN, or the like, and the film thickness thereof is determined based on an etching selectivity between the workpiece film 1 and sidewall spacer masks 7 to be formed in later process, and the like. Furthermore, if the first film 2 is made of C, an etching selectivity between the first film 2 and the resist 3 becomes low, so that it is preferable to form an inorganic film on the first film 2 and form a pattern to the resist 3 on the inorganic film.

Further, the prescribed pattern of the resist 3 is, for example, a line-and-space having a half pitch of about 60 nm.

Figure 1B:
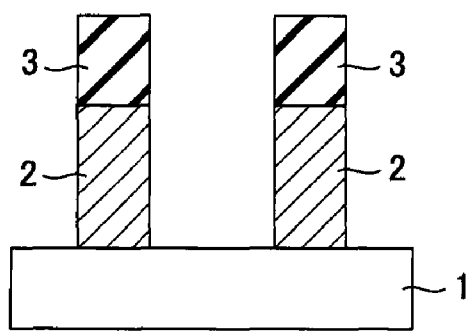

Next, as shown in FIG. 1B, the first film 2 is etched by using the resist 3 as a mask so as to transcribe the prescribed pattern of the resist 3 to the first film 2.

Figure 1C:
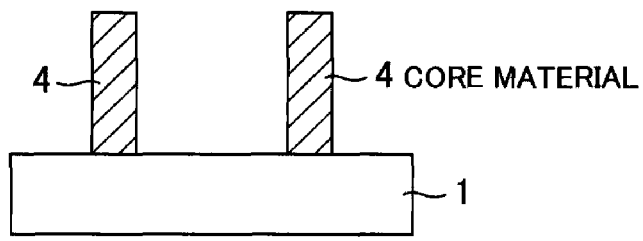

Next, as shown in FIG. 1C, the first film 2 is subjected to a slimming treatment and decreases in width so as to form a core material 4. Further, the resist 3 is removed before or after the slimming treatment.

The slimming treatment is carried out by a wet etching treatment, a dry etching treatment or a combination of the wet etching treatment and the dry etching treatment. For example, if the core material 4 is made of C, an $O_2$ radical treatment, a SH treatment (a treatment by sulfuric acid and hydrogen peroxide solution) or a combination of these is carried out, if the core material 4 is made of $SiO_2$, a HF treatment (a treatment by hydrofluoric acid) is carried out, and if the core material 4 is made of SiN, a hot phosphoric acid treatment is carried out. Further, the width of the core material 4 is, for example, about 30 nm.

Figure 1D:
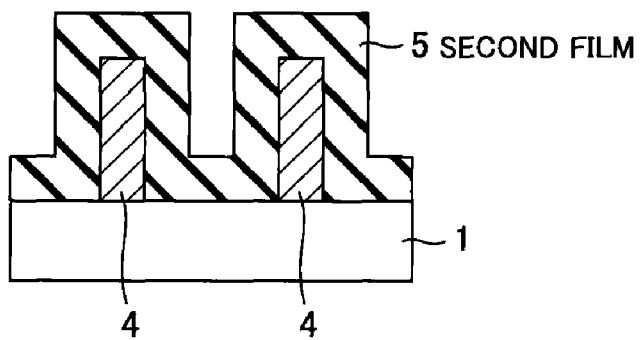

Next, as shown in FIG. 1D, a second film (cover film) 5 is formed so as to conformally cover the upper and side surfaces of the core material 4 by CVD (Chemical Vapor Deposition) method or the like.

The second film 5 is formed from materials capable of realizing high etching selectivity to the core material 4. For example, if the core material 4 is made of C, the second film 5 is made of Si, $SiO_2$ or SiN; if the core material 4 is made of $SiO_2$, the second film 5 is made of Si or SiN; and if the core material 4 is made of SiN, the second film 5 is made of $Si_2$ or C.

Figure 1E:
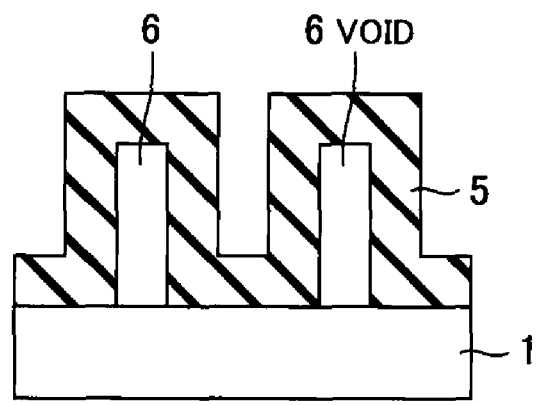

Next, as shown in FIG. 1E, the core material 4 is removed so as to form voids 6 enclosed with the second film 5.

The core material 4 is removed via a hole which is formed in the second film 5 in order to remove the core material 4. The hole (or holes) for removal of the core material 4 is formed in a place or a plurality of places of the second film 5 by lithography method and RIE (Reactive Ion Etching) method, or the like.

Further, the removal of the core material 4 is carried out by a wet etching treatment or a combination of the wet etching treatment and a dry etching treatment. For example, if the core material 4 is made of C, an $O_2$ ashing treatment and a SH treatment is carried out; if the core material 4 is made of $SiO_2$, a HF treatment is carried out; and if the core material 4 is made of SiN, a hot phosphoric acid treatment is carried out.

When the core material 4 is removed, chemical solution used in the wet etching treatment enters into the voids 6 so that force attracting each other is exerted on portions located on both sides of the voids 6 of the second film 5 due to the influence of surface tension and the like exerted on the chemical solution. However, in the present embodiment, the portions located on both sides of the void 6 of the second film 5 are connected with each other through a portion located on the top of the void 6 so that the portions located on both sides of the void 6 of the second film 5 can be prevented from collapsing and deforming due to the force attracting each other.

Figure 1F:
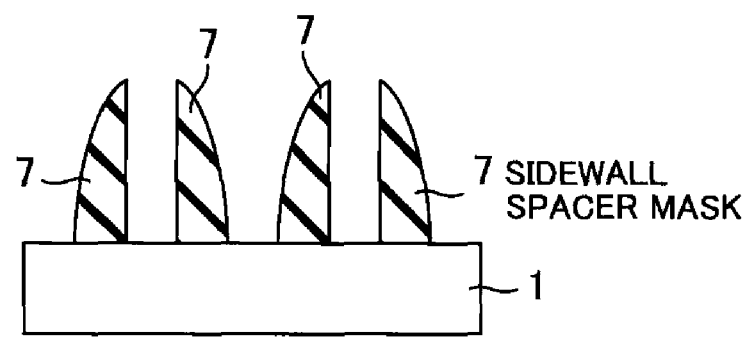
Figure 1G:
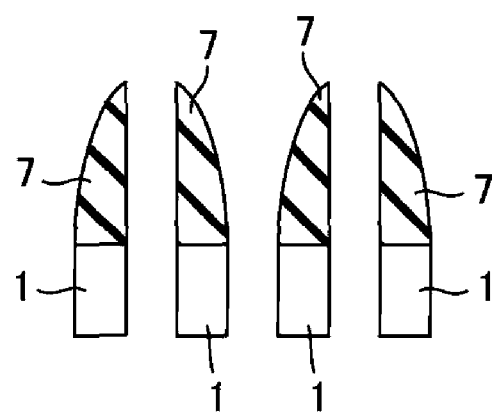
Figure 2:
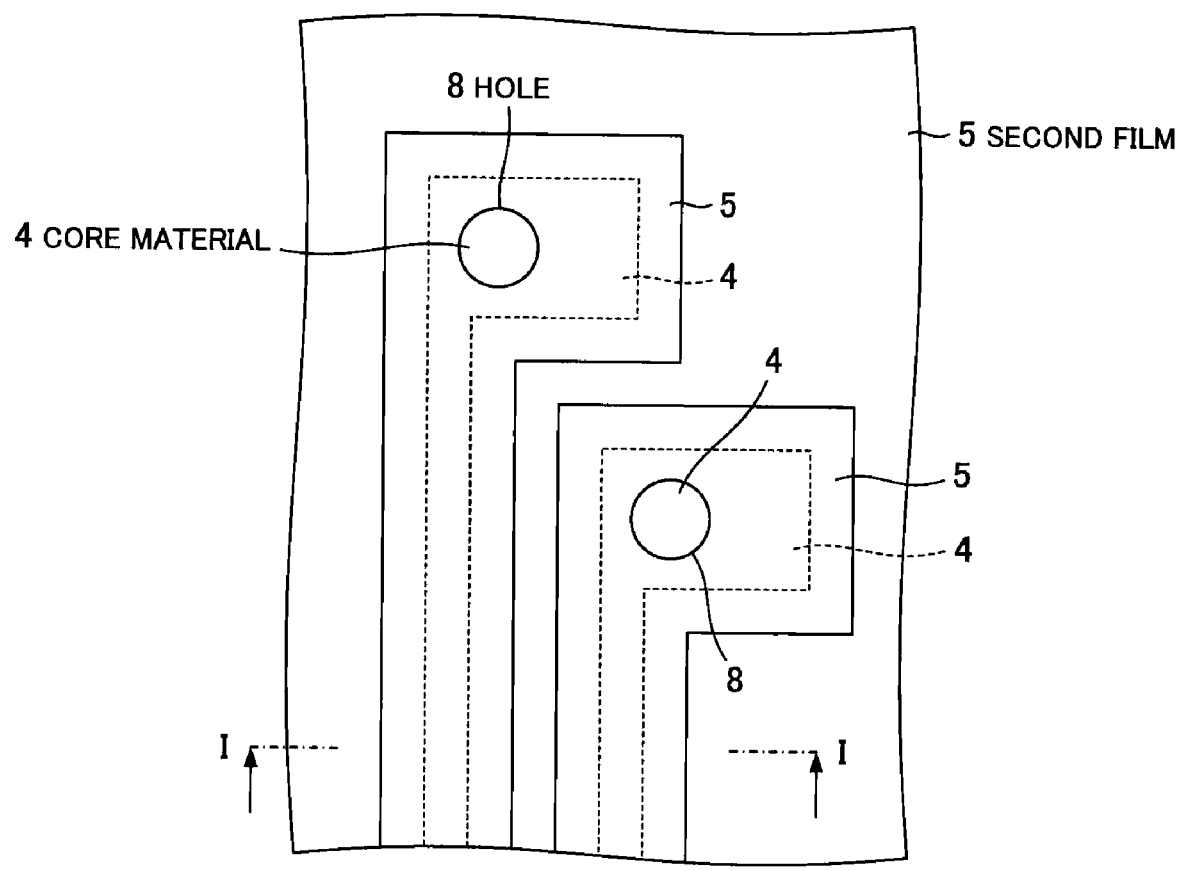
FIG. 2 is a top view showing the semiconductor device according to the first embodiment at the stage of forming holes for removal of core materials in a second film.

FIG. 2 is a top view schematically showing a region which becomes a pad portion for wiring contact of the semiconductor device at the stage of forming holes 8 for removal of core material 4 in a second film 5. Here, cross-sectional views shown in FIGS. 1A to 1G correspond to cross-sectional views in case of seeing a cross-sectional surface taken along the chain line I-I in FIG. 2 in the direction of an arrow. Generally, a pattern obtained based on a fabricating process shown in FIGS. 1A to 1G is a line-and-space pattern having a dimension less than an exposure resolution limit in lithography method, so that the following region is usually disposed at the end of microscopical line-and-space pattern in order to enable the formation of wiring contact by lithography method, the region is a region becomes a pad portion for wiring contact, and pitch of the pattern thereof is enlarged by forming a portion of the core material 4 so as to have a width larger than that of a line pattern in the line-and-space. Further, each of the patterns of components shown in FIG. 2 is one example, and the present embodiment is not limited to the above.

As shown in FIG. 2, it is preferable that the hole 8 for removal of core material 4 is formed in an expanded portion corresponding to regions having relatively large area such as the pad portion for wiring contact. Concretely, it is preferable that the hole 8 for removal of core material 4 is formed within a region located directly above the upper surface of the core material 4 where the pattern pitch is enlarged, that is, the hole 8 is formed so as not to remove portions of the second film 5 located on the side surfaces of the core material 4 (a portion which becomes the sidewall spacer masks 7 in later process) This is due to that if the hole 8 for removal of core material 4 overlaps with the portions of the second film 5 located on the side surfaces of the core material 4, variations in height occur in later process at the portions of the sidewall spacer masks 7 in which the holes 8 for removal of core material 4 has been located, consequently, it becomes difficult to fabricate the workpiece film 1 with a high dimensional accuracy.

After the holes 8 for removal of core material 4 is formed, the core material 4 is removed through the holes 8 for removal of core material 4, so that an state shown in FIG. 1E is obtained.

Next, as shown in FIG. 1F, the second film 5 is removed by a dry etching such as RIE method while leaving portions thereof located on the side surfaces of the void 6 (portions have been located on the side surfaces of the core material 4) so as to form the sidewall spacer masks 7.

In the process of shaping the second film 5 to the sidewall spacer masks 7, a wet etching treatment is not used, so that no the sidewall spacer masks 7 may collapse and deform due to surface tension based on that chemical solution enters into between the sidewall spacer masks 7.

Next, as shown in FIG. 1G, the workpiece film 1 is etched by using the sidewall spacer masks 7 as a mask so as to transcribe the pattern of the sidewall spacer masks 7 to the workpiece film 1. Further, in a region where the sidewall spacer masks 7 are connected with each other at the end of a line-and-space pattern, the pattern can be appropriately separated by lithography method and RIE method, or the like.

For example, in case of forming the resist 3 to the line-and-space pattern having a half pitch of about 60 nm, slimming the first film 2 transcribed the pattern of the resist 3 so as to form the core material 4 having a width about half comparing with that of the first film 2, and forming the sidewall spacer masks 7 having a width almost equal to that of the core material 4, a pattern transcribed to the workpiece film 1 becomes a line-and-space pattern having a half pitch of about 30 nm.

According to the first embodiment, before the second film 5 is shaped to the sidewall spacer masks 7, the core material 4 is removed, so that the sidewall spacer masks 7 can be prevented from collapsing and deforming due to the chemical solution used for removal of the core material 4. Therefore, a pattern can be formed in the workpiece film 1 with a high dimensional accuracy.

Further, as seen in conventional methods, if after the sidewall spacer masks 7 are formed, the core material 4 located between the sidewall spacer masks 7 is removed by a wet etching treatment, the chemical solution used in the wet etching treatment may enter into regions between the sidewall spacer masks 7, the regions where the core material 4 has been formed. As a result, force attracting each other is exerted on the sidewall spacer masks 7 located on both sides of the regions, where the core material 4 has been formed, due to the influence of surface tension and the like exerted on the chemical solution, so that the sidewall spacer masks 7 may collapse and deform.

The force exerted on the sidewall spacer masks 7 in this situation can be shown schematically in the following formula (1).

$$\sigma = 6\gamma \left(\frac{H}{W}\right)^2 \frac{\cos\theta}{D} \qquad (1)$$

In the formula (1), ρ represents a force exerted on the sidewall spacer masks 7, γ represents a surface tension of chemical solution between the sidewall spacer masks 7, H represents a height of the sidewall spacer masks 7, W represents a width of the sidewall spacer masks 7, θ represents a contact angle between the chemical solution and the sidewall spacer masks 7, and D represents a distance between the sidewall spacer masks 7 (a width of the core material 4).

As shown in the formula (1), the less the width and distance of the sidewall spacer masks 7 are, the larger the force exerted on the sidewall spacer masks 7 becomes, so that the more microscopical the dimension of the pattern to be formed becomes, the more the sidewall spacer masks 7 easily collapse and deform. Therefore, the present embodiment is especially advantageous in case of forming microscopical patterns.

Second Embodiment

The present embodiment is different from the first embodiment in terms of leaving some of a plurality of the core materials 4 without removing. Further, with regard to the same matter as that in the first embodiment, the description thereof will be omitted or simplified.

FIGS. 3A to 3D are cross-sectional views showing a fabricating process of a semiconductor device according to the second embodiment.

Figure 3A:
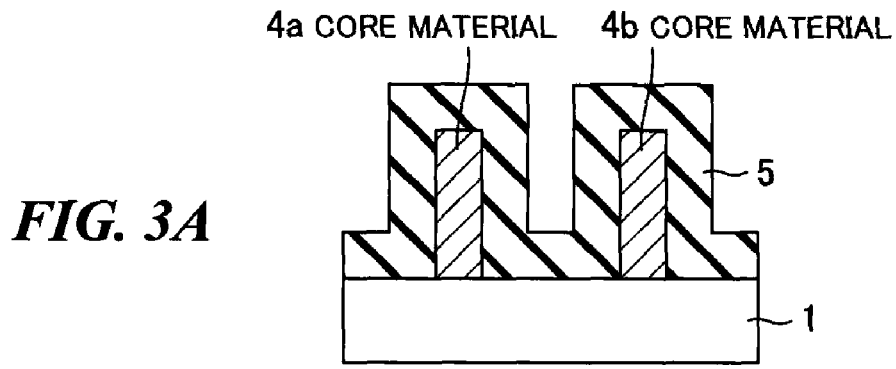
FIGS. 3A to 3D are cross-sectional views showing a fabricating process of a semiconductor device according to the second embodiment.

First, as shown in FIG. 3A, the processes until the process, shown in FIG. 1D, for forming the second film 5 are carried out in the same way as the first embodiment. Here, a core material on the left side of the drawing is shown as a core material 4a and a core material on the right side of the drawing is shown as a core material 4b.

Figure 3B:
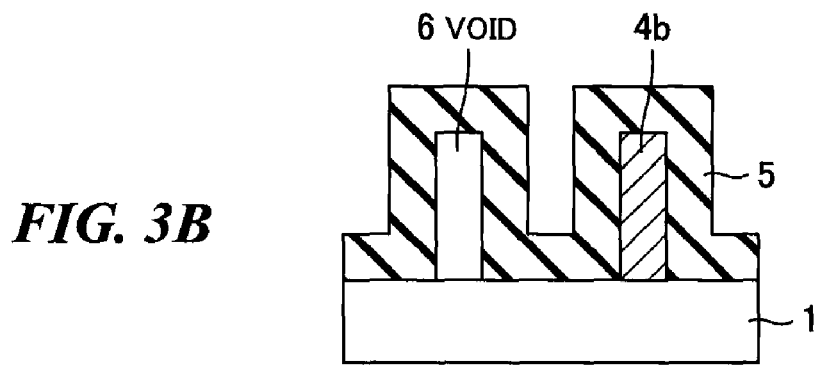

Next, as shown in FIG. 3B, the core material 4a is removed so as to form voids 6 enclosed with the second film 5 while the core material 4b is left without being removed.

Figure 3C:
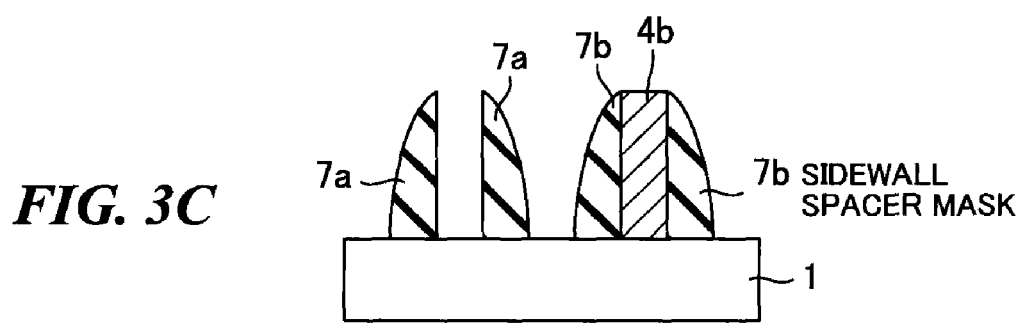
Figure 3D:
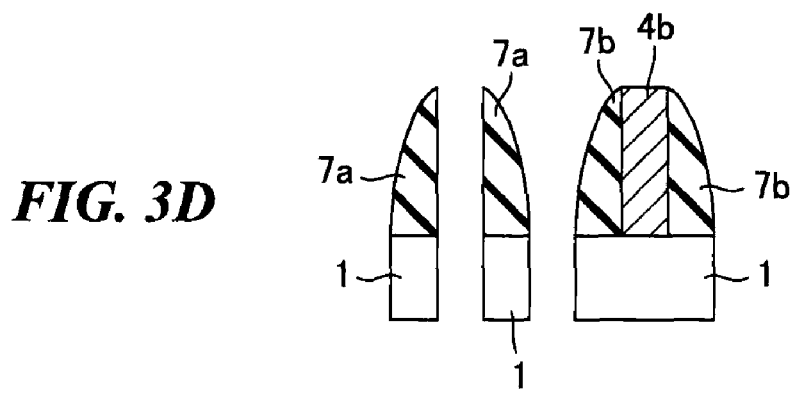
Figure 4:
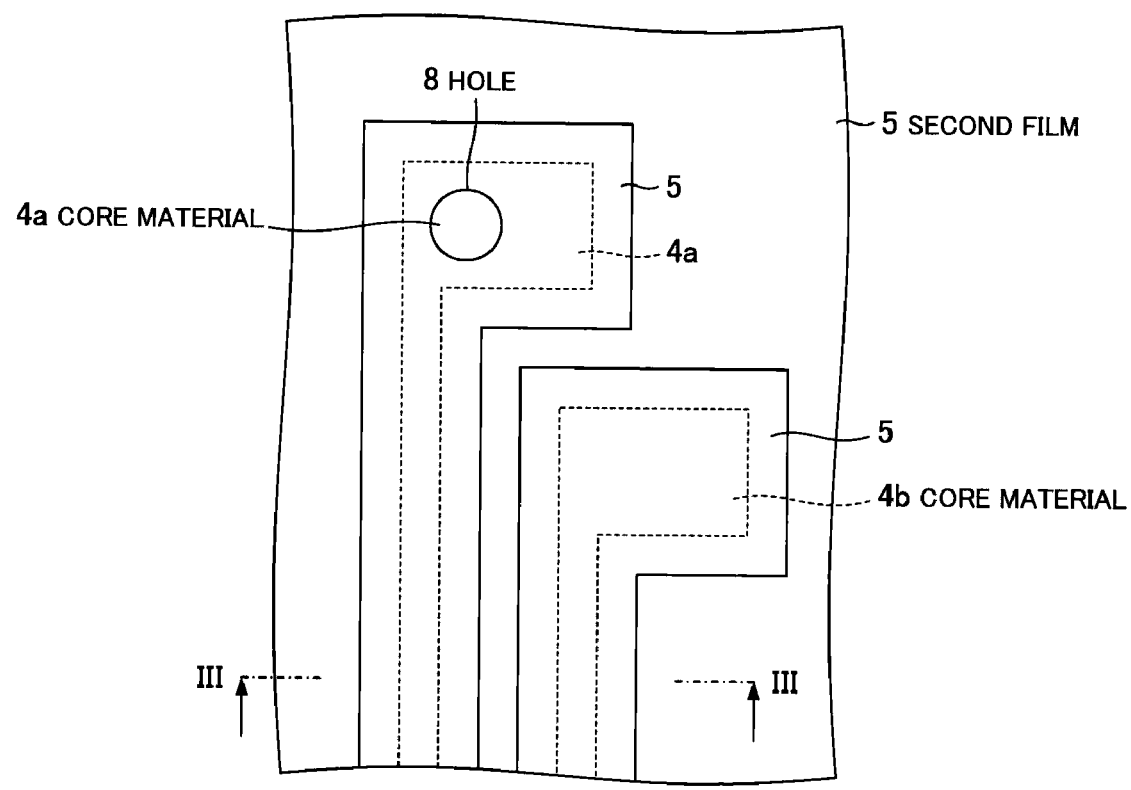
FIG. 4 is a top view showing the semiconductor device according to the second embodiment at the stage of forming a hole for removal of a core material in a second film.

FIG. 4 is a top view showing a region which becomes a pad portion for wiring contact of the semiconductor device at the stage of forming hole 8 for removal of core material 4a in the second film 5. Here, cross-sectional views shown in FIGS. 3A to 3D correspond to cross-sectional views in case of seeing a cross-sectional surface taken along the chain line III-III in FIG. 4 in the direction of an arrow. Note that, each pattern of components shown in FIG. 4 is one example, and the present embodiment is not limited to the above.

As shown in FIG. 4, the hole 8 for removal of core material 4a is formed in the second film 5 on the core material 4a and is not formed in the second film 5 on the core material 4b. In particular, it can be adopted that after a pattern of a resist having holes on the core material 4a and not having holes on the core material 4b is formed by lithography method, the pattern of the resist is transcribed to the second film 5 by RIE method.

After the hole 8 for removal of core material 4a is formed, the core material 4a is selectively removed through the hole 8 for removal of core material, so that an state shown in FIG. 3B is obtained.

Next, as shown in FIG. 3C, the second film 5 is removed by RIE method or the like while leaving each portions thereof located on the side surfaces of the void 6 and the core material 4b so as to form the sidewall spacer masks 7a, 7b.

In the process of shaping the second film 5 to the sidewall spacer masks 7a, 7b a wet etching treatment is not used, so that no the sidewall spacer masks 7a may collapse and deform due to surface tension based on that chemical solution enters into between the sidewall spacer masks 7a. Further, the core material 4b between the sidewall spacer masks 7b is not removed, so that no the sidewall spacer masks 7b may deform.

Next, as shown in FIG. 3D, the workpiece film 1 is etched by using the sidewall spacer masks 7a, 7b and the core material 4b as a mask so as to transcribe the patterns of the sidewall spacer masks 7a, 7b and the core material 4b to the workpiece film 1. Further, the pattern formed by using the sidewall spacer masks 7a have a different width from that of the pattern formed by using the sidewall spacer masks 7b and the core material 4b, so that for example, the narrow width pattern formed by using the sidewall spacer masks 7a can be applied to a stack gate of a flash memory and a broad width pattern formed by using the sidewall spacer masks 7b and the core material 4b can be applied to a selection gate of a flash memory or a gate of a peripheral circuit region.

According to the second embodiment, a part (core material 4b) of a plurality of the core materials is not removed and is left, so that a plurality of patterns having widths different from each other can be transcribed to the workpiece film 1 by using the core material being left (the core material 4b) as a mask. In this case, both the narrow pattern and the broad pattern can be formed on the semiconductor substrate by using the resist patterns without change formed by lithography method at the time of forming the hole 8 for removal of core material 4a.

Other Embodiments

It should be noted that the present invention is not intended to be limited to the above-mentioned first and second embodiments, and the various kinds of changes thereof can be implemented by those skilled in the art without departing from the gist of the invention.

Furthermore, it is possible to arbitrarily combine the configurations of the above-mentioned first to fourth embodiments without departing from the gist of the invention.

What is claimed is:

1. A method of fabricating a semiconductor device comprising:
   forming a core material above a workpiece material;
   forming a cover film to cover the upper and side surfaces of the core material;
   after forming the cover film, forming a hole through an upper surface of the cover material, above the core material, such that a majority of the upper surface of the cover material remains in place after forming the hole;
   removing, through the hole, substantially all the core material, which includes substantially all core material located directly below the hole in the cover material, and removing, through the hole, substantially all core material located remote from the hole with the cover material directly above;
   after removing the core material, removing the cover film while leaving portions thereof located on the side surfaces of the core material formerly, so as to form sidewall spacer masks; and
   etching the workpiece material by using the sidewall spacer masks as a mask.

2. The method of fabricating a semiconductor device according to claim 1, wherein the hole is formed within a region located directly above the upper surface of the core material.

3. The method of fabricating a semiconductor device according to claim 1, wherein another core material is formed above the workpiece material simultaneously with the forming of the core material;
   the cover film is formed to cover the upper and side surfaces of the core material at a first location and that of the another core material at a second location;
   after forming the cover film, the core material is removed while the another core material is left;
   after removing the core material, the cover film is removed while leaving each portions thereof located on the side surfaces of the core material formerly and the another core material, so as to form the sidewall spacer masks; and
   etching the workpiece material by using the sidewall spacer masks and the another core material as a mask.

4. The method of fabricating a semiconductor device according to claim 3, wherein removing the core material comprises selectively forming a hole for removal of the core material in a portion located above the core material of the cover film covering the upper and side surfaces of the core material and the another core material, and selectively removing the core material through the hole selectively formed.

5. The method of fabricating a semiconductor device according to claim 1, wherein the core material is formed by subjecting a pattern of a material film of the core material to a slimming treatment after patterning the material film using photolithography method.

6. The method of fabricating a semiconductor device according to claim 5, wherein the width of the core material is approximately half of that of the pattern of the material film, and the width of the sidewall spacer masks is approximately equal to that of the core material.

7. The method of fabricating a semiconductor device according to claim 3, wherein the core material and the another core material are formed by subjecting a pattern of a material film of the core material and the another core material to a slimming treatment after patterning the material film using photolithography method.

8. The method of fabricating a semiconductor device according to claim 7, wherein the widths of the core material and the another core material are approximately half of that of the pattern of the material film and the width of the sidewall spacer masks is approximately equal to those of the core material and the another core material.

9. The method of fabricating a semiconductor device according to claim 1, wherein the workpiece material is any one of a gate material film of a planar type transistor, a hard mask and a multilayer film, the multilayer film comprising a control gate electrode film, an inter-electrode insulating film and a floating gate electrode film which constitute a flash memory.

10. The method of fabricating a semiconductor device according to claim 3, wherein a pattern of the sidewall spacer masks, which is formed of portions of the cover film located on the side surfaces of the core material, is a pattern of a stack gate of a flash memory, and a pattern of the sidewall spacer masks, which is formed of portions of the cover film located on the side surfaces of the another core material, and the another core material is a pattern of a selection gate of a flash memory or a gate of a peripheral circuit region.

11. The method of fabricating a semiconductor device according to claim 1, wherein a plurality of the holes are formed in the cover film.

12. The method of fabricating a semiconductor device according to claim 1, wherein the core material is formed so as to have an expanded portion in width at the end of a line-and-space pattern.

13. The method of fabricating a semiconductor device according to claim 12, wherein the hole is formed in the cover film located above the expanded portion in width of the core material.

14. The method of fabricating a semiconductor device according to claim 1, wherein the workpiece material is etched so as to have a pad portion for wiring contact, and the hole is formed in the cover film located above a region in which the pad portion is formed.

15. The method of fabricating a semiconductor device according to claim 1, wherein the core material is removed by a wet etching treatment or a combination of the wet etching treatment and a dry etching treatment.

16. The method of fabricating a semiconductor device according to claim 15, wherein the core material comprises C, and the core material is removed by a combination of an $O_2$ ashing and a SH treatment.

17. The method of fabricating a semiconductor device according to claim 15, wherein the core material comprises $SiO_2$, and the core material is removed by a HF treatment.

18. The method of fabricating a semiconductor device according to claim 15, wherein the core material comprises SiN, and the core material is removed by a hot phosphoric acid treatment.

19. The method of fabricating a semiconductor device according to claim 1, wherein the cover film is shaped to the sidewall spacer masks by a dry etching treatment.

* * * * *